United States Patent [19]

Lill

[11] Patent Number: 4,617,534
[45] Date of Patent: Oct. 14, 1986

[54] HIGH-SPEED SWITCHED OSCILLATOR

[75] Inventor: Graham D. Lill, Engadine, Australia

[73] Assignee: U.S. Philips Corporation, New York, N.Y.

[21] Appl. No.: 712,576

[22] Filed: Mar. 15, 1985

[30] Foreign Application Priority Data

Mar. 23, 1984 [AU] Australia ............... PG4217

[51] Int. Cl.[4] ............................................. H03L 5/00
[52] U.S. Cl. ................... 331/117 R; 331/109; 331/183
[58] Field of Search ............... 331/109, 116 R, 117 R, 331/117 FE, 173, 183

[56] References Cited

U.S. PATENT DOCUMENTS 3,991,388 11/1976 Harshbarger .................... 331/117 R
4,199,734 4/1980 Dressen ......................... 331/173 X Primary Examiner—Eugene R. LaRoche
Assistant Examiner—Robert J. Pascal
Attorney, Agent, or Firm—Robert T. Mayer; Bernard Franzblau

[57] ABSTRACT

An electric oscillator comprising a resonant circuit wherein, after switching on the oscillator, it takes a short time to build up to a desired amplitude of oscillation. To reduce the oscillation build-up time of the oscillator, a current supply source is provided along with control elements and switching means for changing the operating mode of the oscillator from a standby mode to an oscillatory mode, and vice versa. During the standby mode a charging current is supplied to the coil of the resonant circuit so that when switching over into the oscillatory mode, the charging current to the coil is interrupted. As a result, the control elements are immediately supplied with oscillations of the desired oscillatory amplitude.

15 Claims, 9 Drawing Figures

HIGH-SPEED SWITCHED OSCILLATOR

BACKGROUND OF THE INVENTION

This invention relates to electric oscillators. In known oscillators, following the instant of oscillator switch-on, the build-up to maximum oscillatory amplitude takes several cycles of oscillation. Similarly, following switch-off, the amplitude of the oscillatory voltage decays slowly over several cycles of oscillation. With such oscillators, there are many applications in which the oscillator output cannot be used during the aforesaid build-up and decay periods.

In the case of oscillators employed in vehicle detection apparatus, it is particularly desirable to reduce or eliminate the duration time of build-up and decay. This is particularly so in vehicle detection equipment where several channels are repeatedly scanned in sequence on a time-sharing basis and an oscillator is used for each channel for the detection of vehicles. As the vehicles to be detected may be travelling at high speed, the time available for each scan period is limited so that oscillation build-up and decay times further limit the performance of the equipment.

An object of the present invention is to reduce the oscillation build-up time of an oscillator.

In accordance with one aspect of the present invention, there is provided an oscillator comprising;

a supply source of substantially constant current incorporating a control element by which the current magnitude may be controlled, a tuned resonant circuit and switching means for changing the operating mode of the oscillator from a standby mode to an oscillatory mode and vice versa by switching the control element from one operating condition to another so that, during the stand-by mode, a charging current is supplied from the current source to the inductance of the resonant circuit. Upon a transition from the standgy mode to the oscillatory mode the charging current supply to the inductance is interrupted. A control loop is provided between the resonant circuit and the control element for supplying a control voltage to the control element which is dependent upon the voltage across the resonant circuit whereby, during the oscillatory mode, a pulse of current is supplied from the current source to the resonant circuit on alternate half-cycles of the oscillatory voltage developed across the resonant circuit.

In one form of the invention, the said control loop includes a keying signal generator connected to key the said control element in synchronism with alternate half-cycles of the oscillatory voltage developed across the said resonant circuit.

It is desirable to stabilize the amplitude of the oscillator output. In accordance with another aspect of the invention, an amplitude stabilization, sensitive to the peak-to-peak amplitude of the oscillatory voltage across the said tuned resonant circuit, is provided to control the amplitude of the keying pulses supplied by the said keying signal generator to key the said control element The amplitude of the keying pulses are controlled in a manner such that the keying pulse amplitude varies inversely with the peak-to-peak amplitude variation of the oscillatory voltage.

In a practical embodiment in accordance with this aspect of the invention, the keying signal generator includes a differential amplifier. The differential has a first input connected to a reference voltage and a second input connected to monitor the oscillatory voltage across the said resonant circuit. The output of the differential amplifier is connected to supply keying pulses to the said control element with the differential amplifier operating to supply keying pulses having a magnitude dependent upon the difference between the peak-to-peak voltage of the oscillatory voltage across the resonant circuit and the reference voltage.

It is also desirable, when the oscillatory is in the oscillatory mode, to reduce the period of time for oscillation to cease following selection of the standby mode. This may be achieved in accordance with a further aspect of the present invention by the addition to the said switching means of a controlled delay means having a first input connected to sense the selected mode of operation and a second input connected to monitor the voltage present across the resonant circuit. The controlled delay means operator when the standby mode is selected, and the oscillator is in the oscillatory mode, to delay transition to the standby mode and the supply of charging current to the inductance of the resonant circuit, until the flow of current in the said inductance due to oscillatory current flow in the resonant circuit is substantially at a maximum in the direction opposite to that of the charging current.

BRIEF DESCRIPTION OF THE DRAWINGS

The invention will now be described in detail with reference to the attached drawings in which.

DESCRIPTION OF THE PREFERRED EMBODIMENTS

Figure 1:
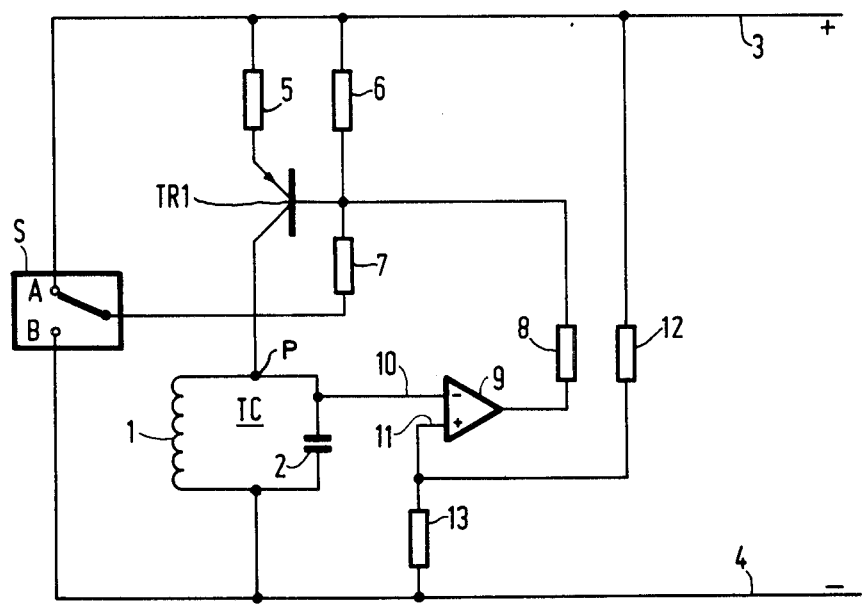
FIG. 1 is a schematic diagram of the circuit of an oscillator in accordance with the present invention.

In the circuit of FIG. 1, a tuned resonant circuit TC formed by an inductance 1 and a capacitance 2 is connected across the supply rails 3 and 4 of a direct current supply source (not shown) via a transistor TR1 having a resistance 5 connected between its emitter electrode and the positive rail 3. The base electrode of the transistor TR1 is connected to the junction of a bias network constituted by the resistances 6 and 7 with the end of the resistance 7 remote from the base of the transistor TR1 being connected to the switch S so that, depending upon whether the switch S is in the position marked "A" or the position marked "B", the end of the resistance 7 remote from the base of the transistor TR1 is either connected to the positive voltage rail 3 or to the negative voltage rail 4. The base of the transistor TR 1 is also connected via a resistance 8 to the output of a keying signal generator in the form of a voltage comparator 9 having its input terminals connected across the capacitance 2. The input terminal 11 of the comparator 9 is connected to the positive rail 3 via a resistance 12 and to the negative rail 4 via a resistance 13.

The values of the resistances 5,6,7 and 8 are chosen so that the transistor TR1 in combination with the direct current supply source (not shown) functions as a supply source of substantially constant current for the resonant circuit TC. In addition, the transistor TR1 together with its associated circuitry, functions as a control element for controlling the magnitude of the current supplied to the resonant circuit TC. For the transistor TR1 to function as a source of substantially constant current in this manner, the values of the resistances 5,6,7 and 8 must be chosen such that, in operation, saturation of the transistor TR1 does not occur below the maximum peak-to-peak voltage developed across the resonant circuit TC throughout the control range exercised by the transistor TR1.

With the switch S in the position marked "B", the oscillator of FIG. 1 is in the standby mode of operation with the voltage divider formed by the resistances 6 and 7 connected across the supply rails 3 and 4 so that current is fed via the resistance 5, the emitter-collector path of the transistor TR1 and through the inductance 1, magnetically charging the inductance 1. The magnitude of the charging current supplied through the inductance 1 is dependent upon the voltage present at the junction of the resistances 6 and 7. Upon switchover of the switch S to the position marked "A", the transistor TR1 is cut-off and the supply of current to the inductance 1 is abruptly interrupted. Despite the cessation of current flow via the transistor TR1, the flow of current in the inductance continues as a circulating current in the resonant circuit formed by the inductance 1 and the capacitance 2. Without the control loop provided by the voltage comparator 9 and the resistance 8, a damped train of oscillation would be produced in the resonant circuit TC. However, owing to the control of the transistor TR1 by the loop, additional energy is supplied to the resonant circuit via the emitter-collector path of the transistor TR1 at the correct times to ensure that the losses of the resonant circuit TC are compensated, whereby oscillation is sustained. In this respect, the (positive) input 11 of the voltage comparator 9 is connected to that electrode of the capacitance 2 adjacent the negative supply rail 4, whereas the (negative) input 10 of the capacitance 9 is connected to the electrode of the capacitance 2 remote from the supply rail 4.

When the (negative) input 10 of the comparator 9 is positive relative to the (positive) input 11, then the output of the comparator 9 will be "low", the "low" state at the output being substantially the potential of the negative rail 4 at approximately ground potential. Alternatively, when the (negative) input 10 is negative relative to the (positive) input 11, then the output of the comparator 9 will be "high".

With the switch S in the position marked "A", and when the output of the comparator 9 is "low", the end of the resistance 8 remote from the base electrode of the transistor TR1 is connected via the comparator 9 to the supply rail 4 so that the voltage divider formed by the resistances 6 and 8 is connected between the supply rails 3 and 4. Under these conditions, the voltage produced at the junction of the resistances 6 and 8 causes the transistor TR1 to conduct so that current flows to the resonant circuit TC via the emitter-collector path of the transistor TR1. With the switch S in the position marked "A", when the output of the comparator 9 is "high", the voltage level at the junction of the resistances 6 and 8 ensures that the transistor TR1 is "cut-off" and no current is supplied to the resonant circuit TC. Accordingly, with the switch S in the position marked "A", each time the potential of the point P swings positive relative to the supply rail 4, owing to the action of the loop formed by the comparator 9 and the resistance 8, current is supplied via the transistor TR1 to the tuned circuit TC.

Figure 2:
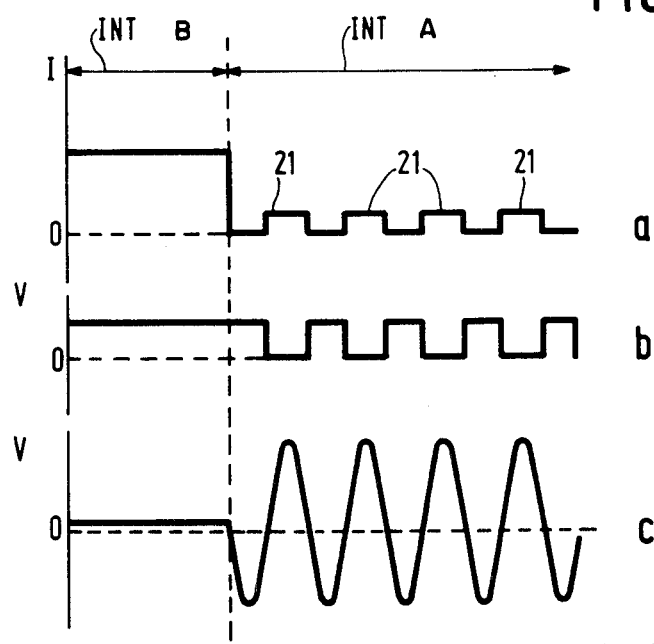
FIGS. 2a, 2b and 2c are diagrammatic representations of waveforms produced at different parts of the circuit of FIG. 1.

For explanation purposes, in time relationship with each other, FIG. 2a shows the level of current flow via the emitter-collector path of the transitor TR1, FIG. 2b shows the voltage level at the output of the comparator 9 and FIG. 2c shows the voltage at the point P, for the condition when the switch S is in the position marked "B" (shown in the figure as INT B) and for the condition when the switch S is in the position marked "A" (shown in the figure as INT A).

During the time that the switch S is in the position "B", the emitter collector current has the relatively high level depicted in FIG. 2a. This current also flows as a charging current through the inductance 1. During this time the voltage at the point P is at a slightly more positive level than that of the supply rail 4. However, the bias network constituted by the resistances 12 and 13 positively biases the input 11 making that input slightly more positive than the input 10 thereby ensuring that the output of the comparator 9 is "high" when the switch S is in the position "B".

Satisfactory transition from the standby mode (or the quiescent mode) to the oscillatory mode requires that the changeover of the switch S from the position marked "B" to the position marked "A" be a sharp changeover. In a practical embodiment of the invention, changeover of the switch S should be accomplished electronically thereby ensuring rapid changeover.

During the time the switch S is in the position marked "A" continuous oscillation is produced in the resonant circuit TC and a continuous oscillatory voltage, ideally of sinusoidal wave shape, is produced at the point P as indicated by FIG. 2c. As the voltage at point P is alternately positive and negative with respect to the rail 4, the output voltage of the voltage comparator 9 is alternately "low" and "high" and serves as a keying signal which is fed to repetitively switch the transistor TR1 between the conductive and the non-conductive states. The level of conduction in the conductive state is determined by the relative values of the resistances 6 and 8. As there is no stabilization system associated with the circuit of FIG. 1, the peak-to-peak amplitude of the alternating voltage at the point P will become limited to a level determined by the magnitude of the supply voltage between the voltage rails 3 and 4.

Pulses of current supplied via the emitter-collector path of the transistor TR1 are denoted in FIG. 2a by the numeral 21. The amplitude of the current flow is constant for the duration of the respective current pulses 21 and of the same amplitude for each pulse 21, being smaller than the amplitude of the constant amplitude flow of current through the transistor TR1 during the standby mode of the oscillator when the switch S is in the position B.

Figure 3:
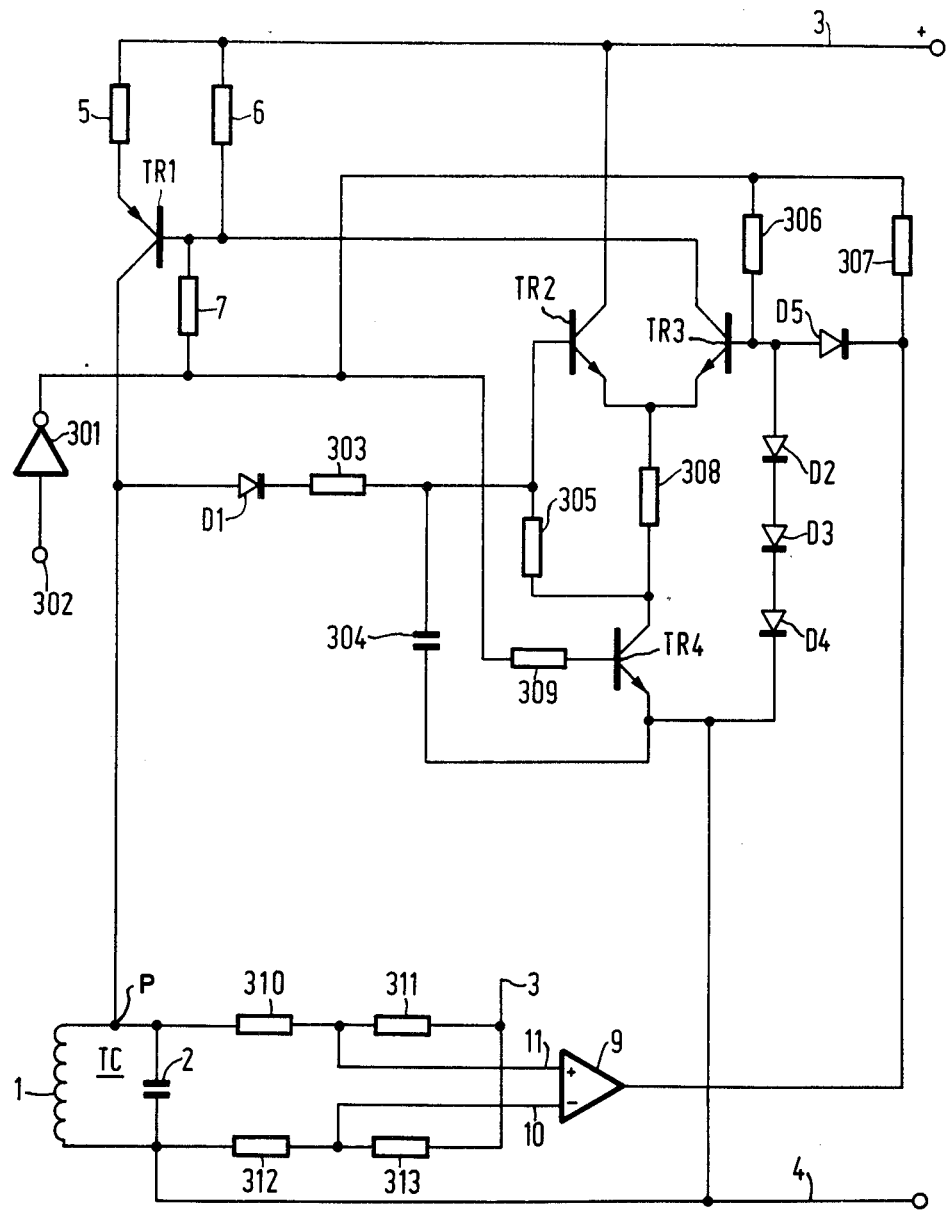
FIG. 3 is a schematic diagram of the circuit of an oscillator in accordance with the invention incorporating stabilisation means in accordance with another aspect of the invention.

An oscillator in accordance with the invention, wherein the amplitude of the oscillator output is stabilized, may be provided by means of the circuit arrangement of FIG. 3. In FIG. 3, similar parts to those of the circuit arrangement of FIG. 1 are denoted by like letters or numerals.

In FIG. 3, an inverter 301 is employed in lieu of the switch S of the circuit of FIG. 1 for switching the oscillator from the standby mode to the oscillatory mode and vice versa. By means of a mode selection means (not shown) the input 302 of the inverter 301 is held "high" for the oscillator to be in the standby mode and "low" for the oscillator to be in the oscillatory mode. With the input 302 "high" the output of the inverter 301 is at the potential of the negative supply rail 4 and with the input 302 "low" the output of the inverter 301 is at the potential of the positive supply rail 3.

The oscillator of FIG. 3 incorporates a differential amplifier constituted by the transistors TR2, TR3 and TR4 and their associated circuitry. The collector electrode of the transistor TR2 is connected to the positive supply rail 3 and its base electrode is connected to the point P via a diode D1 and a resistance 303. The base of the transistor TR2 is also connected via a capacitance 304 to the negative supply rail 4 and via a resistance 305 to the collector electrode of the transistor TR4. The collector electrode of the transistor TR3 is connected to the base electrode of the transistor TR1 and its base electrode is connected, via, the didode D5, to the output of the voltage comparator 9. The base electrode of the transistor TR3 is also connected via a series combination of the diodes D2, D3 and D4 to the negative supply rail 4. The diode D5 is bridged by a series combination of the resistances 306 and 307, the junction of the combination being connected to the output of the inverter 301. The emitter electrodes of the transistors TR2 and TR3 are connected together and via the resistance 308 are connected to the collector electrode of the transistor TR4, the emitter electrode of the latter being connected to the negative supply rail 4. The base electrode of the transistor TR4 is connected via a resistance 309 to the output of the inverter 301.

In the oscillator of FIG. 3, the manner of connection of the voltage comparator across the capacitance 2 is different from that of the oscillator of FIG. 1. In the oscillator of FIG. 3, the (positive) input 11 of the comparator 9 is connected to the junction of the resistances 310 and 311 forming a voltage divider between the positive supply rail 3 and the point P, whereas the (negative) input 10 is connected to the junction of the resistances 312 and 313 forming a voltage divider between the positive supply rail 3 and the negative supply rail 4. In this way, with the oscillator of FIG. 3, the output of the voltage comparator 9 goes "high" when the voltage at the point P is positive with respect to the negative supply rail 4 and goes "low" when the voltage at point P is negative with respect to the supply rail 4. Owing to the presence of the voltage divider constituted by the resistances 312 and 313, the output of the comparator 9 will be "low" during the standby mode.

The operation of the oscillator of FIG. 3 is basically similar to that of the oscillator of FIG. 1. However, during the oscillatory mode, by means of the differential amplifier incorporated in the control loop, the peak-to-peak amplitude of the oscillatory voltage developed across the resonant circuit TC is employed to control the level of energy supplied to the resonant circuit TC by the control element formed by the transistor TR1. In this respect, the oscillatory voltage present at the point P is rectified and compared with a reference voltage. keying pulses having a magnitude dependent upon the difference voltage are employed to control the amplitude of the current pulses supplied via the transistor TR1 to the resonant circuit TC, and in this way stabilize the amplitude of the oscillatory voltage across the resonant circuit TC.

The oscillatory voltage present across the resonant circuit TC, i.e. between the point P and the negative supply rail 4, is rectified by the diode D1 causing the capacitance 304 to become charged to a level determined by the peak-to-peak level of the oscillatory voltage. The time constant of the capacitance 304 and the resistance 303 is chosen to correspond approximately to the peroid of one cycle of the natural frequency of the resonant circuit TC, thereby enabling the charge present across the capacitance 304 to rise rapidly with an increase in the peak-to-peak level of the oscillatory voltage across the tuned circuit TC. The rate of decay of the charge on capacitance 304 is determined by the value of the resistance 305 and the time constant of the capacitance 304 and the resistance 305 is chosen to be equal to several cycles of the oscillation frequency.

The positive going pulses produced at the output of the voltage comparator 9 when the oscillator is in the oscillatory mode have an amplitude approximately equal to the voltage difference between the supply rails 3 and 4 and, by means of the diode D5, the series combination of the diodes D2, D3, D4 and the associated resistances 306 and 307, the amplitude level of each pulse supplied to the base of the transistor TR3 is clamped to a reference level determined by the characteristics of the respective diodes D2, D3 and D4. Preferably, the diodes D2, D3 and D4 are of the same diode type. The voltage at the base of the transistor TR3 will be zero when the oscillatory voltage at the point P is negative with respect to the supply rail 4 and the output of the voltage comparator 9 is "low". On the other hand, the voltage at the base of the transistor TR3 will be clamped to the reference level determined by the characteristics of the diodes D2, D3 and D4 when the oscillatory voltage at the point P is positive with respect to the supply rail 4 and the output of the comparator 9 is "high". If, for example, the junction voltage of each of the diodes D2, D3 and D4 is 0.6 volts, then the reference level to which the voltage at the base of the transistor TR3 is clamped during the intervals that the output of the voltage comparator 9 is "high" will be 1.8 volts.

The base electrode of the transistor TR4 is connected to the output of the ivnerter 301. Accordingly, when the oscillator is in the standby mode, the "low" voltage present at the output of the inverter 301 is fed to the base of the transistor TR4 so that the latter is cut-off and the transistors TR2 and TR3 are also cut-off. On the other hand, with the oscillator of FIG. 3 in the oscillatory mode, the "high" voltage fed from the output of the inverter 301 to the base of the transistor TR4 drives the transistor TR4 to saturation. The emitter-collector current of the transistor TR4 is shared between the respective collector-emitter paths of the transistors TR2 and TR3 in a manner depending upon the respective voltages supplied to the base electrodes.

With the oscillator of FIG. 3 in the oscillatory mode, the base-emitter current of the transistor TR1 and hence the collector-emitter current of the transistor TR1 is determined by the magnitude of the collector-emitter current of the transistor TR3. Of course, the transistor TR3 is non-conductive when the output of the voltage comparator 9 is "low" and hence the base electrode of the voltage of the transistor TR3 is also "low". However, each time that the output of the voltage comparator 9 is "high" the transistor TR3 conducts, the magnitude of the collector-emitter current flow being determined by the voltage difference between the base voltages of the transistors TR2 and TR3. As the base voltage of the transistor TR3 is at the previously described reference level at the relevant period, whereas the base voltage of the transistor TR2 is at a voltage corresponding with the instantaneous peak-to-peak level of the oscillatory voltage across the resonant circuit TC, the magnitude of the pulse of collector-emitter current produced by the transistor TR3 each time the output of the voltage comparator 9 is high, and hence the magnitude of the pulse of current supplied via the emitter-collector path of the transistor TR1, is inversely related to the peak-topeak level of the oscillatory voltage across the tuned circuit TC. As a rise in the peak-to-peak level of the oscillatory voltage at the point P causes a reduction of the energy supplied via the transistor TR1 to the resonant circuit TC and a fall in the peak-to-peak level causes an increase of such energy, the peak-to-peak level of the oscillatory voltage will become stabilized at a particular level dictated by the parameters of the circuit arrangement, and at that particular level the pulses of current supplied via the transistor TR1 will be of magnitude to precisely compensate for circuit losses.

Since the transistor TR4 is cut-off when the oscillator of FIG. 3 is in the standby mode, a charge present across the capacitance 304 at the instant of transition from the oscillatory mode to the standby mode will be retained for a significant period of time so that upon switch-over to the oscillatory mode at a later time, the charge present across the capacitance 304 ensures stabilization at the same level as before. Such an arrangement is advantageous in vehicle detection apparatus wherein a plurality of oscillators operating in a standby mode are each repeatedly and in sequence switched to an oscillatory mode for a short period of time.

Figure 4:
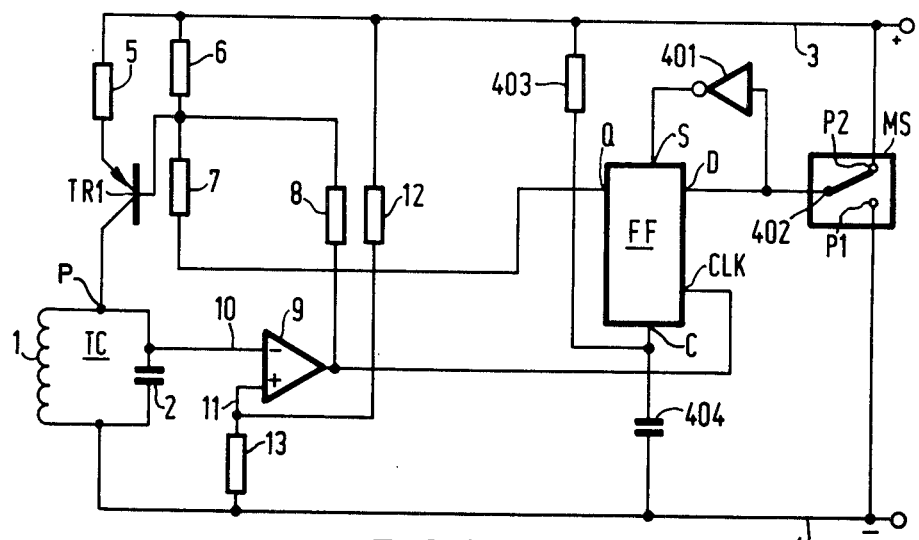
FIG. 4 is a schematic diagram of the circuit of an oscillator in accordance with the invention and incorporating a controlled delay means in accordance with a further aspect of the invention.

In the oscillator of FIG. 4, similar parts to those of the oscillator of FIG. 1 are again denoted by a similar letter or numeral. The oscillator of FIG. 4 is substantially the same as that of FIG. 1 except that the switch S of FIG. 1 there is replaced by the combination of a mode selector switch MS, a D-type flip-flop FF and an inverter 401 interconnected as shown in the figure.

The mode selector switch MS is a two-position switch. With the switch MS in the position P1, the standby mode is selected and the common terminal 402 is connected to the negative supply line 4, whereas with the switch MS in the position P2, the oscillatory mode is selected and the common terminal 402 is connected to the positive supply rail 3.

The data input terminal D of the D-type flip-flop FF is connected to the common terminal 402 of the switch MS and, via the inverter 401, to the set-direct input terminal S of the flip-flop FF. The clear-direct input terminal C of the flip-flop FF is connected to the junction of a resistance 403 and a capacitance 404 which are connected in series between the voltage rails 3 and 4. The clock input terminal CLK of the flip-flop FF is connected to the output of the voltage comparator 9 and the Q output terminal Q of the flip-flop FF is connected to the end of the resistance 7 remote from the base electrode of the transistor TR1. It will be appreciated that when the output Q of the flip-flop FF is "low", the oscillator will operate in the standby mode so that the transistor TR1 will be conductive and a charging current will flow through the inductance 1 via the emitter-collector path of the transistor TR1. When the output Q is "high", the oscillator will operate in the oscillatory mode so that the output of the voltage comparator 9 will be alternately "low" and "high" as the voltage present at the point P repeatedly swings positive and negative relative to the negative supply rail 4. The transistor TR1 is made conductive each time the output of the voltage comparator 9 is "low" so that pulses of current are fed via the emitter-collector path of the transistor TR1, thereby supplying energy to the resonant circuit TC and sustaining oscillations.

The operation of the D-type flip-flop FF is such that data present at the data-input D is transferred to the output Q on the positive-going edge of a pulse applied to the clock-input terminal CLK. In addition, each time the set-direct terminal S becomes "low", the output at the output terminal Q is set to "high" irrespective of the state of the clock input CLK or the input D, whereas each time the clear-direct terminal becomes "low", the output at the output terinal Q is cleared to "low". By way of example, the flip-flop FF may be one of the flip-flops incorporated in a signetics type 74LS74.

The operation of the switching arrangements incorporated in the oscillator of FIG. 4 are as follows:

when the supply voltage is applied to the circuit, owing to the time it takes for the capacitance 404 to become sufficiently charged, the terminal C is kept in a "low" state for a sufficient length of time to "clear" the flip-flop FF so that the output Q is "low". Thereafter, the capacitance 404 is rapidly charged via the resistance 403 to the supply potential so that the capacitance 404 and the resistance 403 serve no further functon until the supply voltage is removed, whereupon the capacitance 404 is discharged in readiness for the next application of the supply voltage. The mode selection switch MS must initially be in the position P1 and in this position the terminal 402 is "low" so that the output of the inverter 401 is "high" and does not affect the state of the flip-flop FF. Since the output Q is "low", the oscillator operates in the standby mode as previously described.

Changeover of the selector switch MS to the position P2 causes the terminal 402 to go "high" and the output of the ivnerter 401 and the input S of the flip-flop FF to become "low", thereby setting the output Q to the "high" state. With the output Q in the "high" state, the oscillator operates in the oscillatory mode as previously described. The oscillator of FIG. 4 should be so proportioned that the magnitude of the circulating current of the resonant circuit TC, while the oscillator is in the oscillatory mode, is equal to the magnitude of the charging current supplied to the inductance 1 while the oscillator is in the standby mode.

With the oscillator of FIG. 4 in the oscillatory mode and with the switch MS in the position P2, the positive-going edge of a "clocking pulse" is supplied to the input terminal CLK from the output of the voltage comparator 9 for every negative half cycle of oscillation, and with the edge of each such pulse the data present at the input D of the flip-flop FF is transferred to the output Q. Since the switch MS is in the position P2, the terminal 402 and the input D is "high". Accordingly, the output Q remains "high" and the oscillator continues to operate in the oscillatory mode so long as the switch MS remains in the position P2.

When the mode selection switch MS is returned to the position P1 so as to terminate the oscillatory mode of the oscillator, the terminal 402 is made "low" so that, via the inverter 401, the terminal S becomes "high". Such removal of the set signal from the terminal S does not change the state of the output Q and, since the output Q is "high", the oscillator remains in the oscillatory mode until the nest-occurring positive going pulse produced by the voltage comparator 9, whereupon the output Q of the flip-flop FF goes "low".

The occurrence of each positive-going edge in the waveform supplied by the voltage comparator 9 to the clocking terminal CLK occurs at the instants of crossover from positive to negative of the oscillatory voltage present at the point P. At such instants, the amplitude of the oscillatory circulating current flowing in the resonant circuit TC is at a maximum, that is to say, flowing at a maximum through the inductance 1. Since the voltage at the output terminal Q changes from "high" to "low" at the first such instant subsequent to return of the mode selector switch MS to the position P1, the transistor TR 1 is switched to a conductive state so that a current having a magnitude substantially equal and opposite to that of the circulating current is supplied to the inductance 1. This causes the oscillation of the resonant circuit to substantially cease and for charging current to thereafter be supplied via the emitter-collector path of the transistor TR 1 until the next changeover of the mode selector switch MS.

Figure 5:
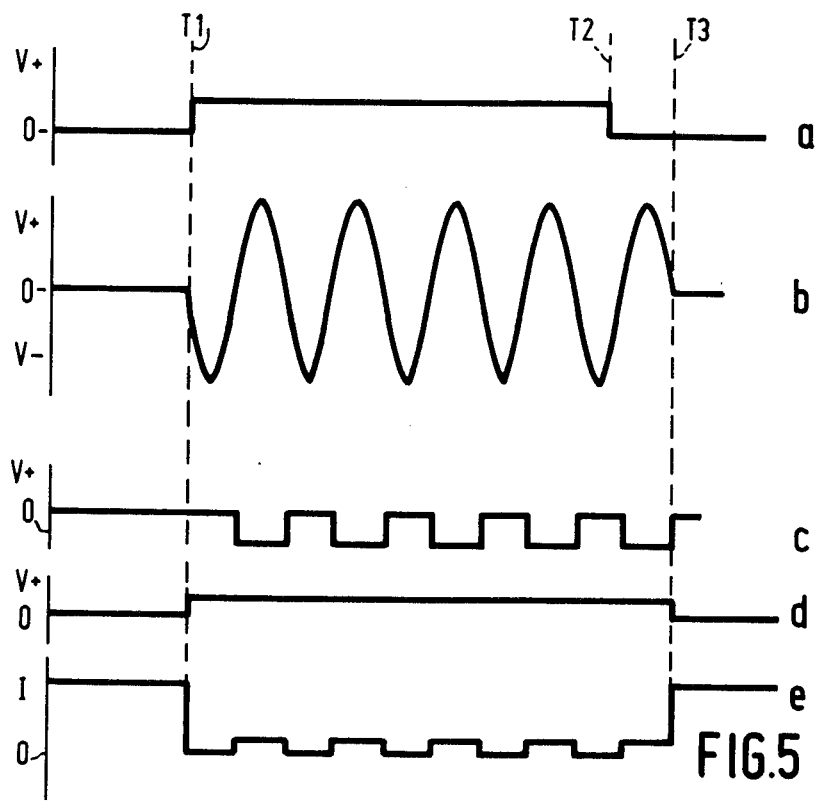
FIGS. 5a, 5b, 5c, 5d and 5e are diagrammatic representations of waveforms related to the operation of the circuit of FIG. 4.

The transition of the oscillator of FIG. 4 from the standby mode to the oscillatory mode and again to the standby mode is shown graphically by FIGS. 5a to 5e. FIG. 5a shows the voltage level of the common terminal 402, FIG. 5b shows the voltage present at the point P, FIG. 5c shows the voltage at the output of the voltage comparator 9, FIG. 5d shows the voltage at the output of the terminal Q of the flip-flop FF and FIG. 5e shows the level of current supplied via the emitter-collector path of the transistor TR1 to the inductance 1.

Prior to the instant T1, the oscillator is in the standby mode so that a charging current having a relatively large magnitude is supplied via the transistor TR1 to the inductance 1 as depicted by the current level shown in FIG. 5e. At the instant T1, switchover of the mode selection switch MS from the standby position P1 to the oscillatory mode positon P2 occurs so that a "high" voltage is produced at the terminal 402. This causes the output terminal Q of the flip-flop FF to go "high" as previously described and as depicted by the waveform of FIG. 5d, cutting the flow of current via the emitter-collector path of the transistor TR1 so that oscillation commences. Between the instance T1 and T2, while the oscillator is in the oscillatory mode, the voltage at the point P follows a substantially sinusoidal wave shape as illustrated by the wave in FIG. 5b. This causes the output of the voltage comparator 9 to alternate between a "high" and a "low" level in accordance with the waveform of FIG. 5c. As a result, pulses of current are supplied via the transistor TR1 supplying energy to the tuned circuit TC, the magnitude of the current pulses being considerably lower than the magnitude of the charging current, as depicted by the shape of the waveform of FIG. 5e.

At the instant T2, as shown by FIG. 5a, the mode selector switch MS is returned to the standby position P1 so that the voltage at the terminal 402 becomes "low". However, the output terminal Q of flip-flop FF remains "high" until the instant T3 when, simultaneously with the leading edge of the next occurring positive-going pulse at the output of the voltage comparator 9, as depicted by the waveforms of FIGS. 5c and 5d, the voltage at the output terminal Q becomes "low", switching the transistor TR1 to the conductive state so that the flow of charging current is resumed via the emitter-collector path of the transistor TR1 and simultaneously inhibiting oscillation so that the oscillatory mode of the oscillator is terminated and the standby mode is resumed.

What is claimed is:

1. An oscillator comprising;
a supply source of substantially constant current including a control element by which the current magnitude may be controlled, a tuned resonant circuit, switching means for changing the operating mode of the oscillator from a standby mode to an oscillatory mode and vice versa by switching the control element from one operating condition to another so that, during the standby mode, a charging current is supplied from the current source to an inductance of the resonant circuit, and upon transition from the standby mode to the oscillatory mode the charging current supply is interrupted, a control loop coupled between the resonant circuit and the control element for supplying a control voltage to the control element which is dependent upon the voltage across the resonant circuit whereby, during the oscillatory mode, a pulse of current is supplied from the current source to the resonant circuit on alternate half-cycles of an oscillatory voltage developed across the resonant circuit.

2. An oscillator as claimed in claim 1 wherein the said control loop includes a keying signal generator connected to key the said control in synchronism with said alternate half-cycles of the oscillatory voltage developed across the resonant circuit.

3. An oscillator as claimed in claim 2 further comprising an amplitude stabilization means responsive to the peak-to-peak amplitude of the oscillatory voltage across said tuned resonant circuit to control the amplitude of keying pulses supplied by the said keying signal generator to key the said control element in such a manner that the amplitude of the keying pulses varies inversely with the peak-to-peak amplitude variaton of the oscillatory voltage.

4. An oscillator as claimed in claim 2 wherein the keying signal generator comprises a differential amplifier having a first input connected to a reference voltage and a second input connected to monitor the oscillatory voltage across the said resonant circuit, an output of the differential amplifier being connected to supply keying pulses to the said control element with the differential amplifier operating to supply keying pulses having a magnitude dependent upon the difference between the peak-to-peak voltage of the oscillatory voltage across the resonant circuit and the reference voltage.

5. An oscillator as claimed in claim 1 wherein the said switching means includes a controlled delay means havinga first input connected to sense the selected mode of operation and a second input connected to monitor the voltage present across the resonant circuit, the controlled delay means operating, when the standby mode is selected and the oscillator is in the oscillatory mode, to delay transition to the standby mode and the supply of charging current to the inductance of the resonant circuit until the flow of current in the said inductance, due to oscillatory current flow in the resonant circuit, is substantially at a maximum in a direction opposite to that of the charging current.

6. An oscillator as claimed in claim 2 wherein the switching means includes a controlled delay means having a first input connected to sense the selected mode of operation and a second input connected to monitor the voltage present across the resonant circuit, the controlled delay means being operative to delay transition from the oscillatory mode to the standby mode and thereby delay the supply of charging current to the inductance of the resonant circuit until the flow of current in the said inductance due to oscillator current flow in the resonant circuit is substantially at a maximum in the direction opposite to that of the charging current.

7. An oscillator having a standby mode and an oscillatory mode comprising:
a source of constant current including a control element for controlling the amplitude of the current supplied by the current source as a function of a control voltage applied to a control terminal of the control element, a parallel resonant circuit including a capacitor and an inductor connected in parallel with one another, switching means coupled to said control terminal for switching the oscillator between the standby mode and the oscillatory mode and vice versa by switching the control element between first and second operating conditions, means for coupling said constant current source to said parallel resonant circuit so that in the standby mode the current source supplies a constant charging current to the inductor of the resonant circuit via said control element, said switching means being operative upon the control element to interrupt the flow of charging current to the inductor from the current source upon a transistion of the oscillator from the standby mode to the oscillatory mode, and a control loop coupling the parallel resonant circuit to the control terminal for supplying a control voltage to the control element which is dependent upon a voltage developed across the resonant circuit, said control voltage, in the oscillatory mode, being operative on the control element so that a pulse of current is supplied by the current source to the resonant circuit in alternate half cycles of an oscillatory voltage developed across the resonant circuit.

8. An oscillator as claimed in claim 7 wherein the control element comprises a controlled semiconductor device and said coupling means connects the semiconductor device in series with the resonant circuit across a pair of DC voltage supply terminals.

9. An oscillator as claimed in claim 7 wherein the coupling means connects the control element in series with the parallel resonant circuit and said control loop includes a comparator having one input coupled to a source of reference voltage and a second input responsive to the voltage developed across the resonant circuit, an output of the comparator supplying said control voltage to the control terminal in the form of a keying pulse waveform during the oscillatory mode, whereby the control element is triggered into conduction in said alternate half cycles of the oscillatory voltage of the resonant circuit to supply said current pulses to the resonant circuit.

10. An oscillator as claimed in claim 7 wherein the coupling means connects the control element in series with the parallel resonant circuit and said control loop includes a keying signal generator for triggering the control element into conduction in said alternate half cycles of the oscillatory voltage of the resonant circuit in a manner so as to supply to the resonant circuit current pulses of lower magnitude than said charging current.

11. An oscillator as claimed in claim 7 wherein the control loop further comprises a keying signal generator for supplying keying pulses to the control element in synchronism with said alternate half cycles of the oscillatory voltage and including amplitude stabilization means responsive to said oscillatory voltage across the resonant circuit to make the amplitude of the keying pulses vary inversely with the amplitude of the oscillatory voltage.

12. An oscillator as claimed in claim 11 wherein the amplitude stabilization means comprises a differential amplifier having a first input connected to a source of reference voltage and a second input connected to monitor the oscillatory voltage across the resonant circuit, and means coupling an output of the differential amplifier to said control terminal to supply keying pulses thereto of a magnitude determined by the deviation of the oscillatory voltage from the reference voltage.

13. An oscillator as claimed in claim 7 wherein the switching means comprises a switching device for selecting the standby mode or the oscillatory mode and a controlled delay means having a first input coupled to the switching device to sense the selected mode of operation and a second input connected to monitor the voltage across the resonant circuit, the controlled delay means having an output coupled to the control terminal of the control element to control the operating condition of the control element, the controlled delay means being operative when the oscillator is in the oscillatory mode and the switching device is switching to the standby mode to delay switching of the control element and thereby delay the oscillator transition to the standby mode, the transition delay to the standby mode being such that the supply of charging current to the inductor of the resonat circuit occurs when an oscillatory current in the inductor of the resonant circuit is at a maximum in a direction opposite to that of the charging current supplied to the inductor.

14. An oscillator as claimed in claim 7 wherein the control element comprises a controlled semiconductor device and said coupling means connects the semiconductor device in series with the resonant circuit, and said control loop includes means for delaying the control voltage to the semiconductor device when the oscillator is switched from the oscillatory mode to the standby mode, the oscillator circuit producing, in the oscillatory mode, a circulating current in the resonant circuit of a magnitude equal to the charging current supplied to the inductor in the standby mode.

15. An oscillator as claimed in claim 14 wherein the delaying means delays the control voltage for a time period such that the semiconductor device switches into conduction, during the transition from the oscillatory mode to the standby mode, at an instant when it will supply a charging current to the inductor of the resonat circuit that is equal and opposite to said circulating current in the inductor.

* * * * *